United States Patent [19]

Chu et al.

[11] Patent Number: 5,107,459
[45] Date of Patent: Apr. 21, 1992

[54] STACKED BIT-LINE ARCHITECTURE FOR HIGH DENSITY CROSS-POINT MEMORY CELL ARRAY

[75] Inventors: Christopher M. Chu, Irvine, Calif.; Sang H. Dhong, Mahopac, N.Y.; Wei Hwang, Armonk, N.Y.; Nicky C-C. Lu, Yorktown Heights, N.Y.

[73] Assignee: International Business Machines Corporation, Armonk, N.Y.

[21] Appl. No.: 513,315

[22] Filed: Apr. 20, 1990

[51] Int. Cl.$^5$ .................... G11C 5/06; G11C 11/24
[52] U.S. Cl. ............................ 365/63; 365/72; 365/149
[58] Field of Search .................. 365/51, 63, 149, 72

[56] References Cited

U.S. PATENT DOCUMENTS

| | | | |
|---|---|---|---|
| 4,156,938 | 5/1979 | Proebsting et al. | 365/63 |
| 4,402,063 | 8/1983 | Wittwer | 365/154 |
| 4,476,547 | 10/1984 | Miyasaka | 365/205 |
| 4,570,241 | 2/1986 | Arzubi | 365/205 |
| 4,710,789 | 12/1987 | Furutani et al. | 365/51 X |
| 4,816,884 | 3/1989 | Hwang et al. | 357/23.6 |
| 4,922,453 | 5/1990 | Hidaka | 365/63 |

OTHER PUBLICATIONS

Mashiko, K. et al., "A 90ns 4Mb Dram in a 300 mil DIP", ISSCC Digest of Technical Papers, 12 (1987) (Mashiko I).
Mashiko, K. et al., "A 4-Mbit DRAM with Folded-Bit-Line Adaptive Sidewall-Isolated Capacitor (FASIC) Cell", IEEE J. Solid-State Circuits, 22 (5):643 (1987) (Mashiko II).
Shah, A. H. et al., "A 4-Mbit DRAM with Trench--Transistor Cell" IEEE J. Solid State Circuits, 21 (5):618 (1986) (Shah I).
Shah, A. H., et al. "A 4Mb DRAM with Cross-Point Trench Transistor Cell", ISSCC Digest of Technical Papers, 268 (1986) (Shah II).
Hwang, W. et al., "Folded Bit Line Configuration" IBM Technical Disclosure Bulletin, 30 (3):1314 (1987).
Dhong, S. H. et al., "Double-Traversing Pseudo-Folded-Bitlin Design for Cross-Point Memory Cells", IBM Technical Disclosure Bulletin, 30 (11):246 (1988).
Arzubi, L. et al., "One-Device Memory Cell Arrangement with Improved Sense Signals", IBM Technical Disclosure Bulletin, 23 (6):2331 (1980).
Arzubi, L., "Folded Bit Line Connection to Sense Latch", IBM Technical Disclosure Bulletin, 24 (9):4800 (1982).
Nagatomo, M. et al, "A High Density 4M DRAM Process Using Folded Bit Line Adaptive Side-Wall Isolated Capacitor (FASIC) Cell" IEDM Technical Digest, 144 (1986).

Primary Examiner—Joseph A. Popek
Assistant Examiner—Michael A. Whitfield
Attorney, Agent, or Firm—Scully, Scott, Murphy & Presser

[57] ABSTRACT

A stacked bit-line architecture utilizing high density cross-point memory arrays forms a DRAM semiconductor memory device. The true and complementary bit-line pairs connected to the respective memory cell arrays are formed in two metal layers, one above the other. A bit-line interconnector region is provided that uses a third interconnection layer together with the first and second layers to transpose the vertical stacking of each pair and to transpose the planar alignment of adjacent bit-line pairs. The DRAM memory cell array has a high density cross-point memory cell architecture that behaves electrically as a folded bit-line array.

14 Claims, 6 Drawing Sheets

STACKED BIT-LINE ARCHITECTURE FOR HIGH DENSITY CROSS-POINT MEMORY CELL ARRAY

BACKGROUND OF THE INVENTION

1. Field of the Invention

The present invention relates to dynamic random access memory architectures and more particularly, to an architecture having an open bit-line cross-point memory cell layout that electrically behaves as a folded bit-line structure.

2. Description of the Prior Art

Figure 1A:
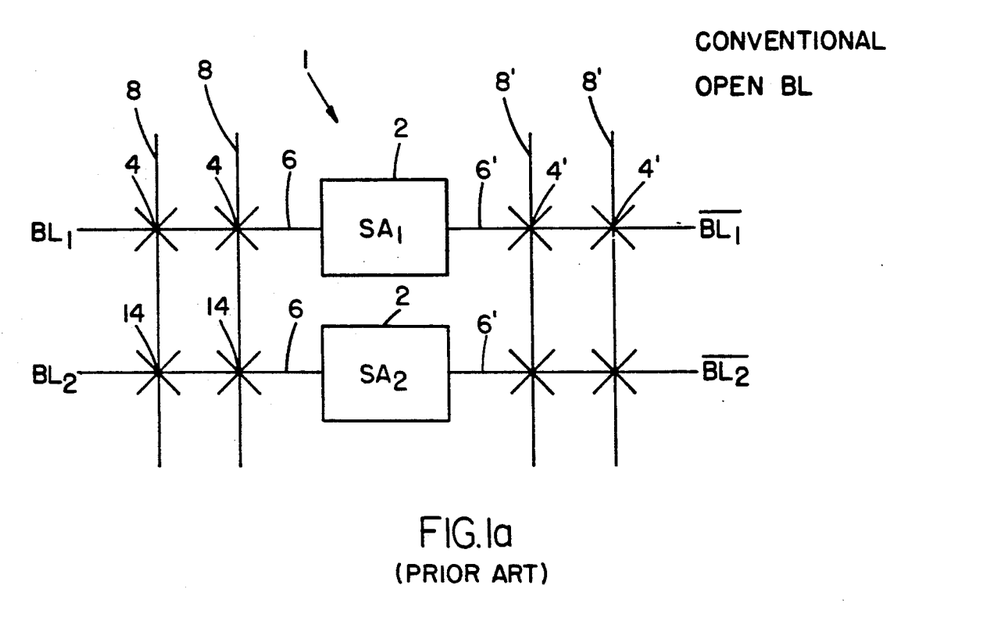
FIG. 1a is a schematic of a conventional prior art open bit-line architecture.

The early dynamic random access memory (DRAM) used an open bit-line architecture to provide a cross-point memory cell array as shown in FIG. 1a. The conventional open bit-line architecture 1 includes sense amplifiers 2 and true cross-point memory cells 4 formed at the intersection of bit-lines 6 and word lines 8 on one side of the sense amplifiers 2 and complementary cross-point memory cells 4' formed at the intersection of bit-lines 6' and word lines 8' formed on the other side of sense amplifiers 2. The open bit-line architecture provides high packing density of memory cells and permits a cross-point layout of cell structures that optimizes the available cell matrix space. Several deficiencies in the open bit-line architecture have been recognized which include the presence of differential mode noise that leads to low noise immunity and small sense amplifier pitch that creates sense amplifier layout difficulties. In addition, column decoders, which are arranged on the borders of the DRAM chip, are difficult to position. Moreover, the bit-lines and their complements are located in different substrate wells thus contributing to more bit-line swing noise. Furthermore, alpha-particle sensitivity of the device is increased from the differential mode noise thereby increasing the occurrence of single event upset errors.

Figure 1B:
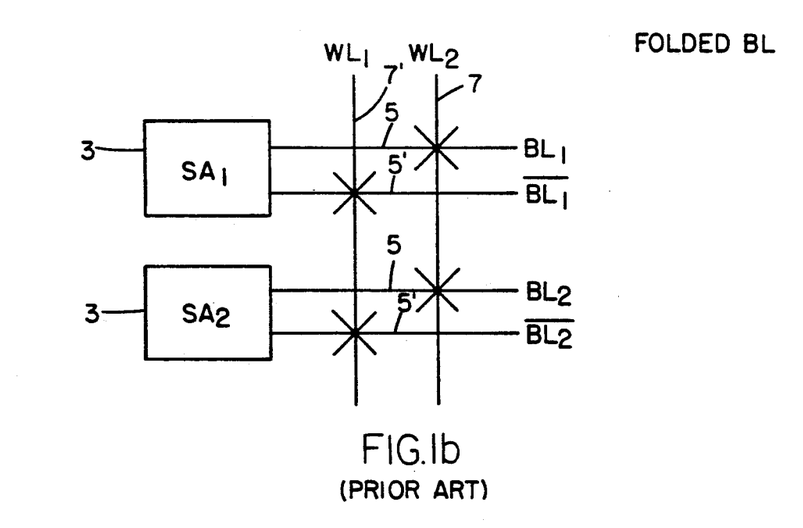
FIG. 1b is a schematic of a conventional prior art folded bit-line architecture.

The folded bit-line architecture as shown in FIG. 1b was adopted to improve the noise immunity of the device and at the same time provide larger layout pitches for the sense amplifier and decoders. As shown in FIG. 1b, the conventional folded bit-line architecture includes a plurality of sense amplifiers 3 each having a corresponding pair of true and complement bit-lines 5 and 5' extending from one side of the amplifiers 3. Memory cells are formed at the intersection of bit-lines 5 and word lines 7 and bit-lines 5' and word lines 7'. The folded bit-line architecture provides high noise immunity resulting from better noise rejection of common mode noise and relaxed sense amplifier pitch allowing easier implementation of sense amplifiers. In addition, the column decoders can be easily arranged along the border of the cell matrix. Moreover, both true bit-lines and their complements are located in the same substrate well thereby creating common mode noise cancellation of substrate noise. Furthermore, the reduction of alpha-particle sensitivity of the device is achieved since some alpha bits may result in a common mode disturbance. However, the folded bit-line architecture provides lower packing density of memory cells than the open bit-line architecture and also cannot utilize a cross-point layout cell structure resulting in an inefficient use of the cell matrix space.

One attempt in the prior art to provide a DRAM architecture taking the advantages of both the open bit-line and the folded bit-line architectures is described by Shah, et al. entitled "A 4-Mbit DRAM with Trench-Transistor Cell", IEEE J. Solid State Circuits, 21(5) 1986. Shah, et al. disclose a double-ended adapted folded bit-line architecture which uses a segmented bit-line approach. Segments are connected to a second metal global bit-line through segment select transistors. Capacitor imbalance is present and a complicated technique is disclosed whereby various segment select transistors are turned on and off depending on which segment is being read.

Also of interest is the publication in IBM Technical Disclosure Bulletin Vol. 30, No. 11, Apr. 1988 at page 246 which discloses a double-traversing pseudo-folded bit-line architecture that is laid out in a cross-point structure but results in a folded-bit-line type connection to the sense amplifier and column decoders, shown in FIG. 2 of the publication. There is no disclosure of the means for implementing the design to provide a minimum of use of the substrate surface area.

There is a desire to provide a DRAM architecture that utilizes the advantages of both a cross-point memory cell open bit-line architecture and the folded bit-line architecture and that may be easily implemented and readily adapted to the advancing multi-megabit DRAM architectures of the future.

SUMMARY OF THE INVENTION

The present invention is directed to a semiconductor memory device utilizing a three dimensional approach by stacking true and complement bit-line pairs vertically one above the other in two interconnection layers of metallization. The semiconductor memory device of the invention is implemented with a high density cross point memory cell array layout that behaves electrically as a folded bit-line array. The bit-line structure of the invention includes means for transposing the vertical stacking of the true/complement bit-line pair. The memory cell array is arranged in a matrix of rows and columns with a plurality of word lines extending in the columns and a plurality of bit-line pairs extending in the rows. Each bit-line pair extends across the entire width of the structure such that one of the true and complement bit-lines of each pair is connected to a memory cell in each column. In the bit-line structure, pairs of adjacent bit-lines form a sub-array of first and second bit-line pairs, and the transposing means includes means for transposing the rows in which the bit-line pairs extend in each sub-array. The structure further includes a plurality of sense amplifiers arranged on the borders of the structure and the true and complement bit-lines of each pair are connected to a corresponding one of the amplifiers.

The transposing means is implemented by utilizing a third interconnection layer in addition to the first and second layers. The interconnection scheme of the transposing means includes means for interconnecting the first layer of metallization above the third layer and for interconnecting the second layer above the first layer. The interconnections are provided by contacts with the interconnection layers being otherwise insulated from each other. A contact is also provided to interconnect the first layer of metallization to the memory cells.

The stacked bit-line architecture of the present invention results in a high noise immunity folded-bit-line structure using the more conventional and higher density open bit-line scheme. The formation of the bit-line pairs in metal lines vertically one above the other that extends throughout the entire width of the structure eliminates capacitive mismatch. In addition, the use of three interconnection layers in the transposing means provides an optimum and compact design that can be replicated with no spacial penalties throughout the rest of the cell matrix. The structure may include n number of transposing means where n is an odd number. The use of additional transposing means will further reduce noise with only a relatively small reduction in the usable matrix space. Because of the replicable nature of the design and inherent layout characteristics, the architecture of the present invention can readily adapt to any scaling of dimensions for upcoming multi-megabit DRAM technological advances.

DETAILED DESCRIPTION OF THE INVENTION

Figure 2A:
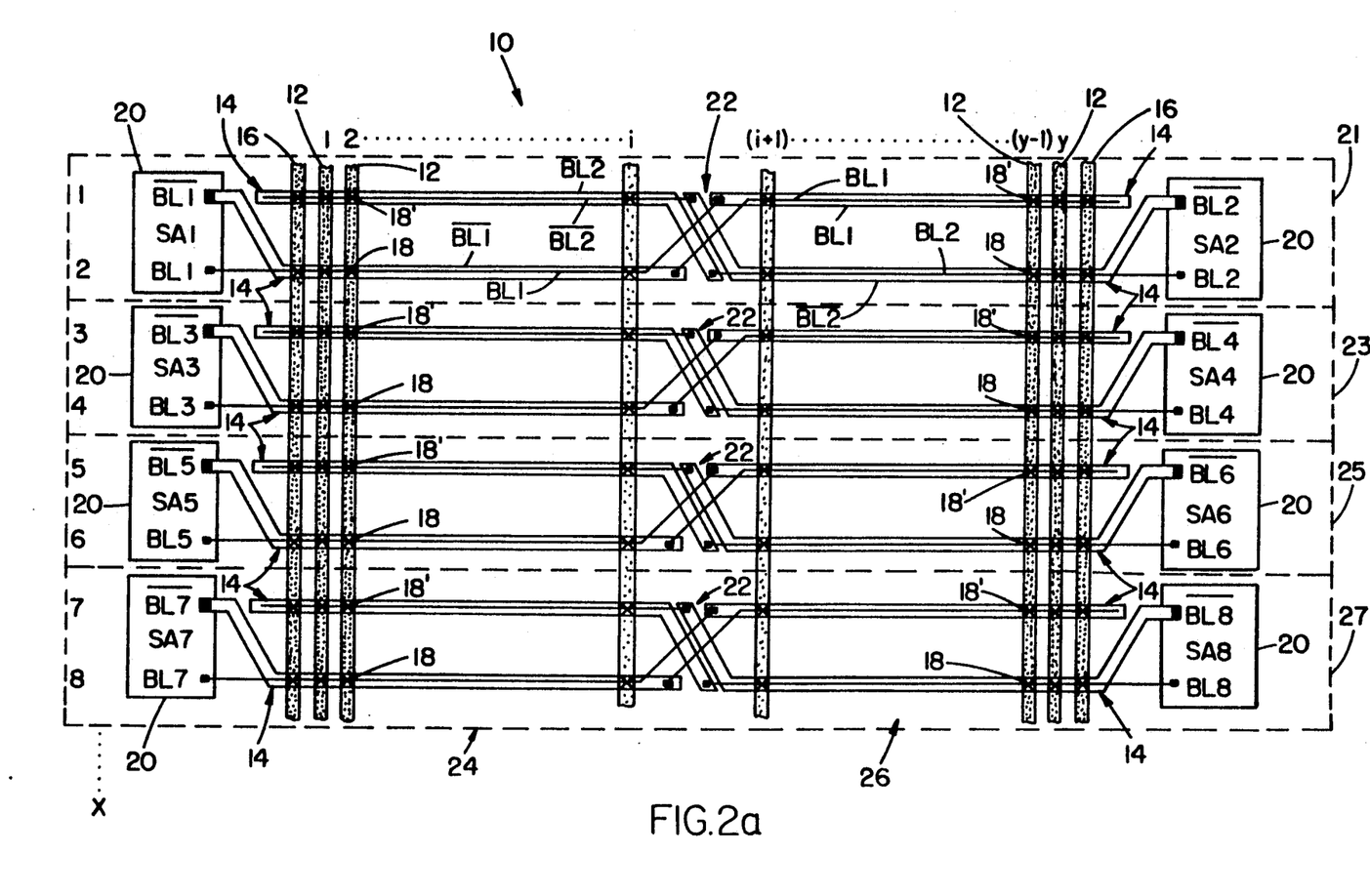
FIG. 2a is a schematic diagram of the stacked bit-line architecture of the present invention.

Referring now to FIG. 2a, there is shown a schematic plan view of the bit-line structure of the semiconductor memory device of the present invention. The array 10 is formed of a plurality of word lines 12 and bit-lines 14 arranged orthogonally in rows and columns to form a matrix. The word lines 12 form the columns of the matrix and the bit-lines 14 form the rows of the matrix. The matrix is an x by y matrix in which there are x rows and y columns. FIG. 2a depicts a portion of the matrix showing rows numbered 1-8 . . . x and columns numbered 1, 2 . . . i, 1+1 . . . y−1, y. Word lines 16 are dummy word lines used as a reference. At each intersection of word lines 12 and bit-lines 14 there is located a semiconductor memory cell 18 or 18′ formed in a semiconductor substrate. Bordering the array 10 are a plurality of sense amplifiers 20.

The bit-lines 14 are each comprised of a pair of bit-lines vertically stacked one above the other in first add second interconnection layers of metallization. Each of the bit-lines pairs is comprised of a true and corresponding complement bit-line that are connected to a corresponding sense amplifier. As a convention, bit-lines are designated BL1, BL2, BL3 . . . BL8 and the complement bit-lines are designated $\overline{BL1}$, $\overline{BL2}$, $\overline{BL3}$ . . . $\overline{BL8}$. In addition, the sense amplifiers are designated SA1, SA2, SA3 . . . SA8. Furthermore, the thin solid line represents the first layer of metallization and the double-lined strip represents the second layer of metallization that is arranged above the first layer of metallization. Therefore, as shown in FIG. 2a, sense amplifier SA1 has an input connected to bit-line BL1 formed in the first layer of metallization and an input connected to bit-line $\overline{BL1}$ formed in the second layer of metallization. Likewise, sense amplifier SA2 has an input connected to bit-line BL2 formed in the first layer of metallization and an input connected to bit-line $\overline{BL2}$ formed in the second layer of metallization.

Moreover, the array 10 of the present invention includes means 22 for transposing the vertical stacking of the true and complement bit-lines of each of the bit-line pairs 14 so that the true and complement bit-lines are in opposite layers of metallization. The structure depicted in FIG. 2a shows a single column of transposing means 22 dividing the structure into sections 24 and 26. In section 24, bit-line BL1 extends in the first layer of metallization and bit-line $\overline{BL1}$ extends in a second layer of metallization. Transposing means 22 transposes the bit-line pair so that in section 26 bit-line BL1 extends in the second layer of metallization and bit-line extends in the first layer of metallization. Similarly, in section 26 bit-line BL2 extends in the first layer of metallization and bit-line extends in the second layer of metallization and transposing means 22 transposes the bit-line pair so that in section 24, bit-line $\overline{BL2}$ extends in the second layer of metallization and bit-line BL2 extends in the first layer of metallization.

In addition to transposing the vertical stacking of the bit-line pairs 14, the transposing means 22 transposes the row within which the pair extends with an adjacent bit-line pair. Adjacent bit-line pairs form sub-arrays of first and second bit-line pairs. As shown in FIG. 2a, a first sub-array 21 is formed by the bit-line pairs in rows 1 and 2, a second sub-array 23 is formed by the bit-line pairs in rows 3 and 4, and sub-arrays 25 and 27 are similarly formed. In sub-array 21, the bit-line pair formed by bit-line $\overline{BL1}$ extends in row 2 in section 24 and the bit-line pair formed by bit-line BL2 and $\overline{BL2}$ extends in row 1 in section 24. Transposing means 22 transposes the planar alignment of the bit-line pairs so that the bit-line pair formed by bit-line BL1 and $\overline{BL1}$ extends in row 1 in section 26 an the bit-line pair formed by bit-line BL2 and $\overline{BL2}$ extends in row 2 in section 26. The transposing means 22 transposes both the vertical alignment of the bit-lines in each bit-line pair, and the planar alignment of the bit-line pairs in each sub-array.

Furthermore, bit-line BL1 is connected to true memory cells 18 in row 2 in section 24 and bit-line $\overline{BL1}$ is connected to complementary memory cells 18′ in row 1 in section 26. Similarly, bit-line BL2 is connected to true memory cells 18 in row 2 in section 26 and bit-line $\overline{BL2}$ is connected to complementary memory cells 18′ in row 1 in section 24.

Figure 2B:
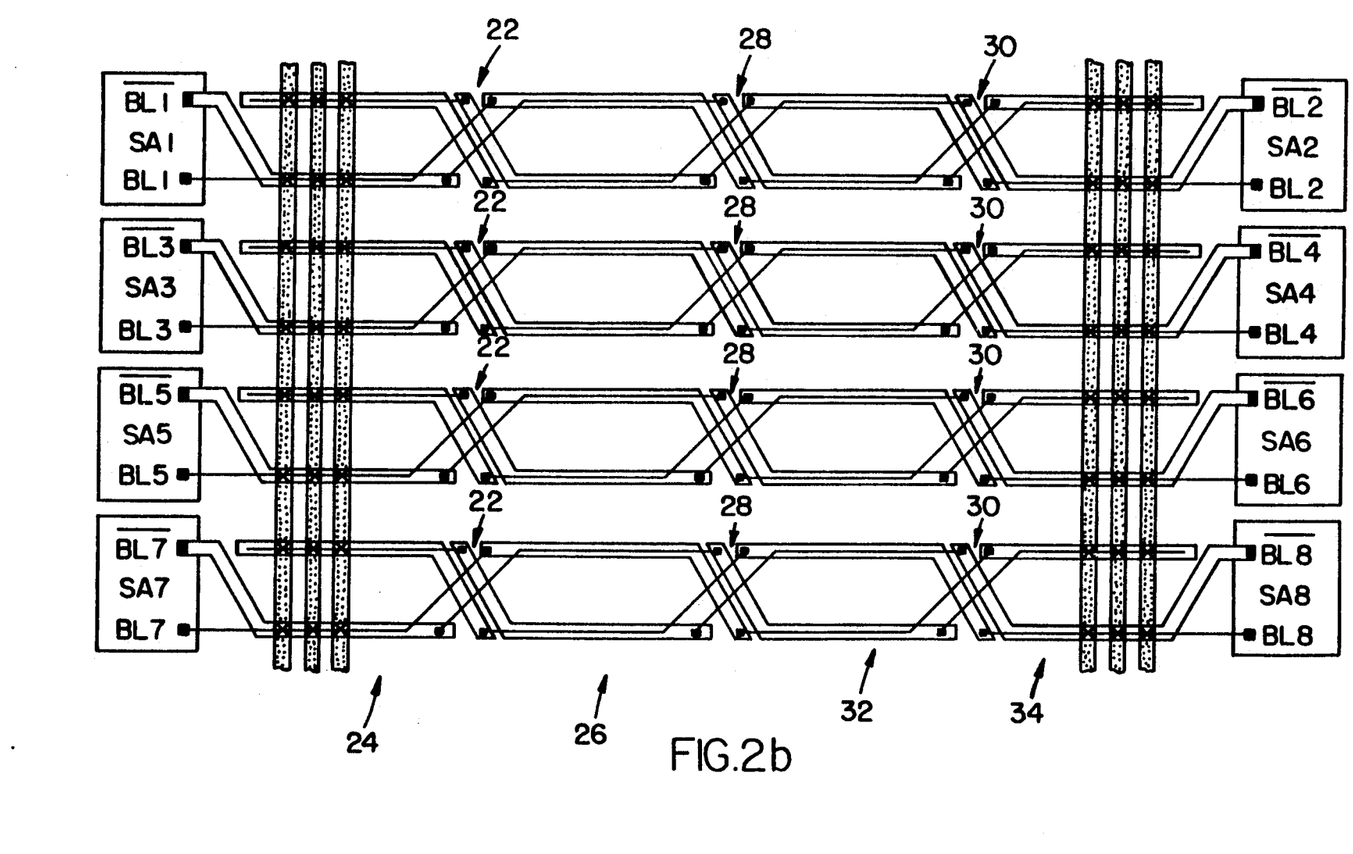
FIG. 2b is a schematic diagram of the architecture of the present invention having four memory cell arrays.

In addition, the sub-arrays of bit-line pairs may be transposed both vertically and planarly n times where n is an odd integer. Depicted in FIG. 2(b), is a device 10 in which each of the sub-arrays of bit-line pairs are transposed three times. In addition to the column of transposing means 22 forming sections 24 and 26, there is a second column of transposing means 28 and a third column of transposing means 30 forming additional sections 32 and 34. The use of the additional transposing means further reduces noise with only a relatively small reduction in usable matrix space.

The stacked bit-line architecture of the present invention provides the advantages of both the folded and open bit-line architectures. The stacked bit-line architecture provides high cell density with high noise immunity. The design provides repeatable structures consisting of pairs of folded bit-lines, that facilitates implementation of the architecture on high density chips.

As DRAM's continue to become more dense (16 Mbit to 64 Mbit and beyond), the low noise immunity from the open bit-line architecture becomes unacceptable. By utilizing two layers of metal for each bit-line pair, a high noise immunity folded bit-line structure can be achieved while using the more conventional and higher density open bit-line scheme. The use of a second layer of interconnection to run above the primary bit-line layer, and then transposing the two layers, either once or any odd number of times, the desirable folded bit-line architecture with high density characteristics can be realized. Capacitive mismatch along the bit-lines and their complements are held to a minimum by the symmetrically implemented wiring pattern. As in the folded bit-line structure, all sense amplifiers and decoders border the cell matrix on both sides, allowing a relaxation of sense amplifier pitch and reducing bit-line swing noise. Another benefit from the stacked bit-line architecture is its ability to suppress substrate noise by aligning all selected bit-lines and their complements in the same substrate well. After the sense amplifiers are activated, the logic levels in both the bit-lines and their complements will experience very similar amounts of substrate noise. Since the capacitance between adjacent bit-lines is divided and connected equally to the paired and capacitively matched bit-lines, the design cancels differential noise as well as the matched substrate noise by converting it into common-mode noise.

Figure 3A:
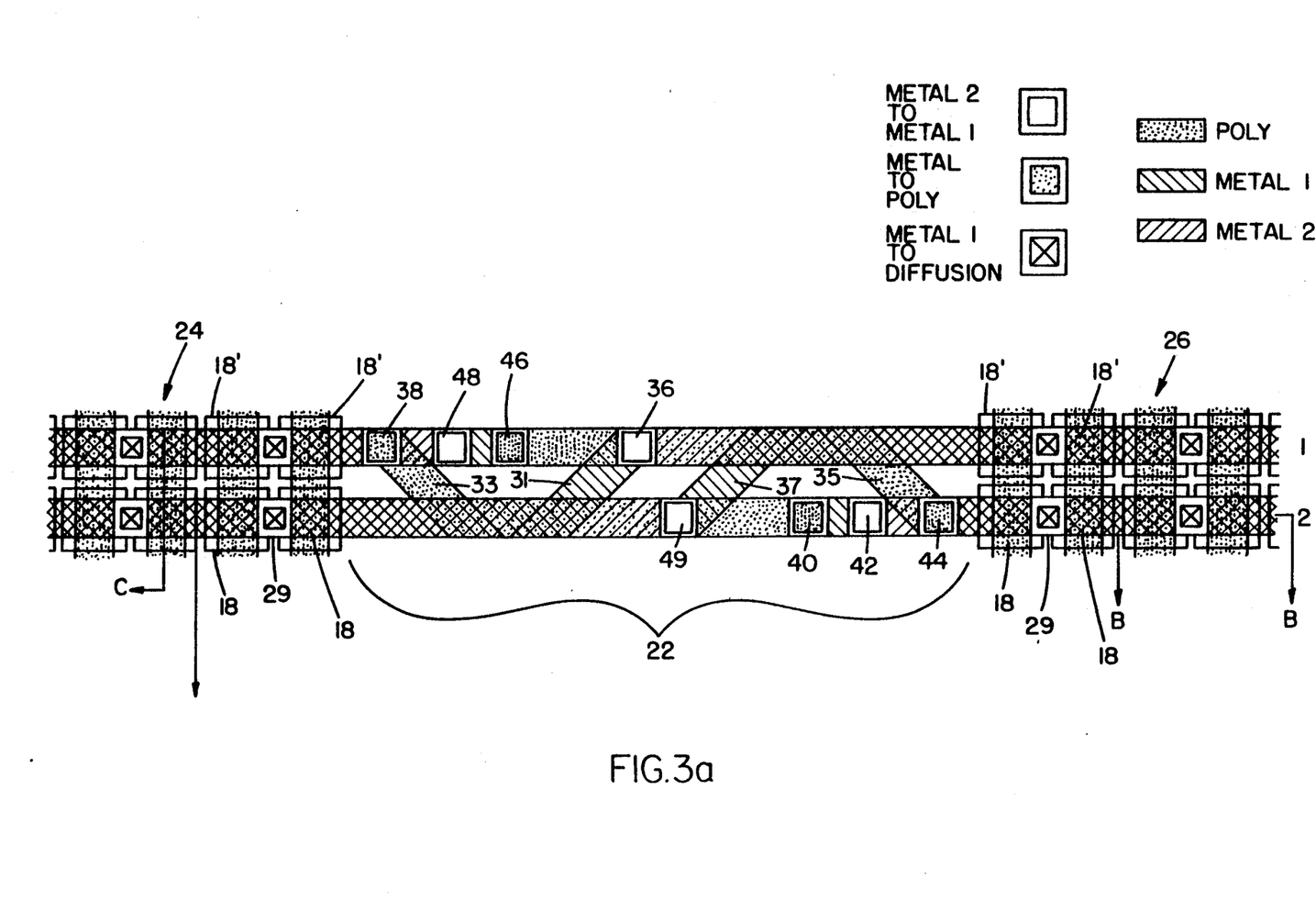
FIG. 3a is a bit-line layout view of the means for interconnecting the bit-lines between memory cell arrays.
Figure 3B:
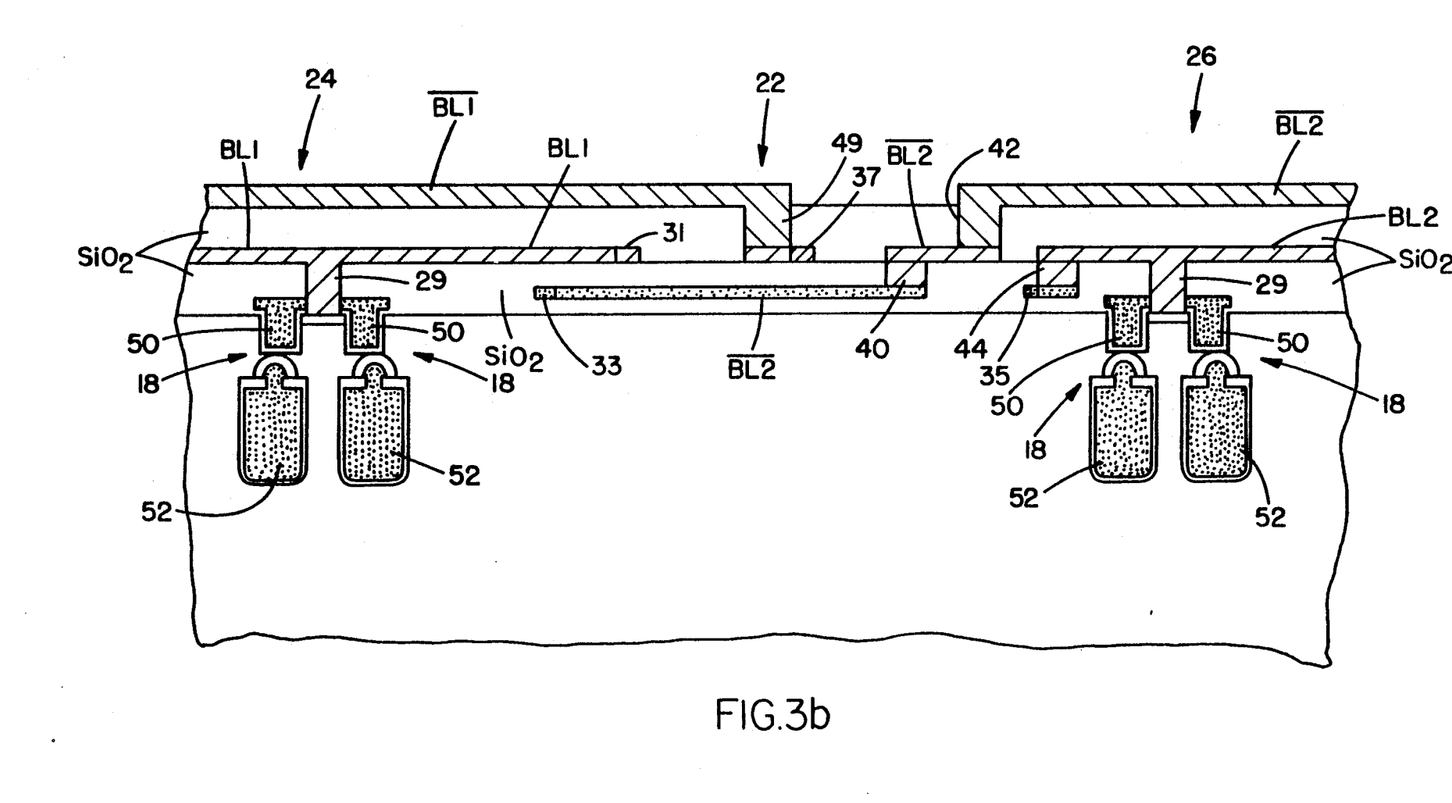
FIG. 3b is a cross-sectional view of the view of FIG. 3a taken along the line B—B.
Figure 3C:
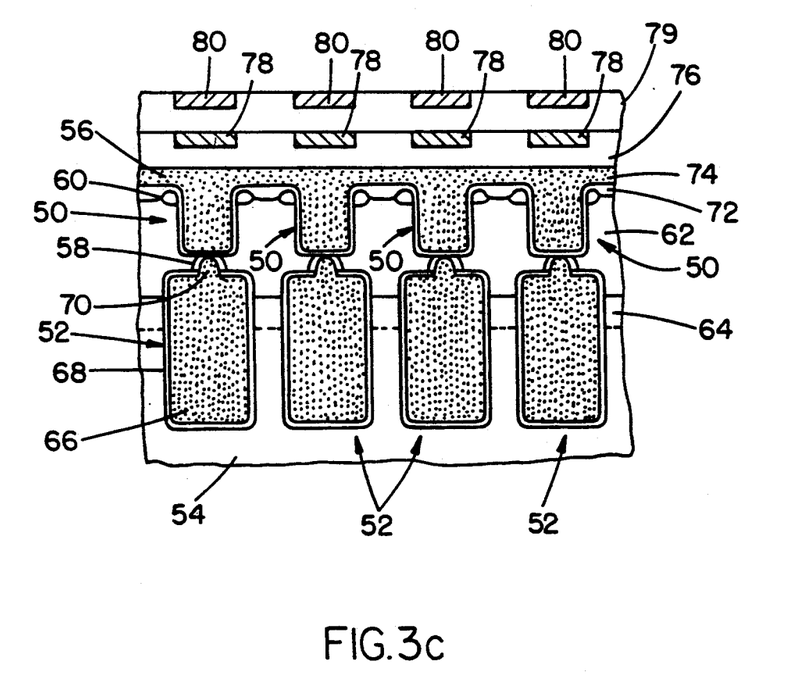
FIG. 3c is a cross-sectional of the view of FIG. 3a taken along the line C—C.

Referring now to FIGS. 3a, 3b and 3c, a more detailed description of array 10 and more particularly, transposing means 22, will be provided herein. Transposing means 22 is shown in the preferred embodiment which utilizes three interconnection layers and appropriate contact to interconnect the second layer above the first layer and the first layer above the third layer. The three interconnection layers forming means 22 may each take the form of any one of a metal, such as aluminum and tungsten, or polycrystalline silicon. The preferred embodiment of FIG. 3a provides a compact design with no loss in matrix space between bit-lines.

In FIG. 3a the first interconnection layer is indicated by slant lines angled from the upper left to the lower right, the second interconnection layer is indicated by slant lines angled from the lower left to the upper right and the third interconnection layer is indicated by random dot shading. Typically, the third layer will be formed of a polycrystalline silicon and the first and second layers will be formed of aluminum. The three layers are vertically arranged so that the third layer is in the lower level, the first layer is in the intermediate level and the second layer is in the upper level. In addition, three contacts are shown, one with a square with random dot shading inside a square depicting a contact between the first metal layer and the polysilicon layer, one with an X inside a square depicting a contact between the first metal layer and a diffusion layer forming part of the memory cells 14, and a square within a square depicting a contact between the second metal layer and the first metal layer.

FIG. 3a is a top view of sub-array 21 of FIG. 2a. In row 2, section 24, bit-line BL1 is formed in the first metal layer and is connected to each of the true memory cells 18 by contacts 29. BL1 extends into means 22 in row 2 and is angled by line 31 to contact 36 in row 1. Contact 36 interconnects the first metal layer in the intermediate level to the second metal layer in the upper level. Bit-line BL1 extends in the upper level across the remainder of means 22 and across section 26 above memory cells 18' and bit-line $\overline{BL1}$. In row 1, section 24, bit-line $\overline{BL2}$ is formed in the first metal layer and is connected to each of the memory cells 18' by contacts 29. Bit-line $\overline{BL2}$ extends within means 22 to contact 38, which interconnects the first metal layer and the polysilicon layer. Bit-line $\overline{BL2}$ is angled by polysilicon contact line 33 to transfer bit-line $\overline{BL2}$ to row 2. Bit-line BL2 extends in row 2 to contact 40, which interconnects the polysilicon layer and the first metal layer. Bit-line $\overline{BL2}$ extends in row 2 in the first metal layer from contact 40 to contact 42 in row 2, which interconnects the first metal layer and the second metal layer. Bit-line $\overline{BL2}$ extends in row 2 in the second metal layer across section 26 above bit-line BL2.

Bit-line BL2 is formed in the first metal layer in section 26 in row 2 and is connected to each of the memory cells 18 by contacts 29. Bit-line BL2 extends into means 22 to contact 44 which interconnects the first metal layer and the polysilicon layer. Bit-line BL2 is angled in the polysilicon contact layer at 35 to transfer BL2 to row 1 and to extend BL2 to contact 46. Contact 46 interconnects the polysilicon layer and the first metal layer. Bit-line BL2 extends in the first metal layer in row 1 to contact 48 which interconnects the first metal layer and the second metal layer. Bit-line BL2 extends across section 24 in the second metal layer above bit-line $\overline{BL2}$. Bit-line $\overline{BL1}$ is formed in section 26 in the first metal layer and is connected to memory cells 18' by contacts 29. Bit-line $\overline{BL1}$ extends into means 22 in row 1 and is angled by line 37 to transfer $\overline{BL1}$ to row 2 at contact 49. Contact 49 interconnects the first metal layer to the second metal layer. Bit-line $\overline{BL1}$ extends within means 22 in row 2 to section 24. Bit-line $\overline{BL1}$ extends across section 24 in the second metal layer above bit-line BL1.

The bit-line pairs BL1/$\overline{BL1}$ and BL2/$\overline{BL2}$ formed in rows 1 and 2 comprise sub-array 21. In one embodiment, the interconnections and transfer of the bit-lines in means 22 in each additional sub-array of array 10 is identical to that described for sub-array 21. In an alternative embodiment, alternate sub-arrays would have an interconnection and transfer scheme that is mirror image of adjacent sub-arrays.

FIG. 3b is a cross-section taken along line BB of FIG. 3a which is a cross section through row 2. Bit line BL1 extends in the first metal layer and is connected to the access transistor of memory cells 18 by contact 29 in section 24. Each contact 29 is positioned between pairs of memory cells and therefore connects the bit-line to two cells. A portion of the angled contact line 31 appears in row 1 that transfers BL1 to row 2. Bit-line $\overline{BL1}$ extends above bit-line BL1 in section 24 and into means 22 to contact 49. Contact 49 interconnects bit-line $\overline{BL1}$ from the second metal layer to the first metal layer and a portion of angled line 37 is shown. Contact 42 connects bit-line $\overline{BL2}$ to the first metal layer and $\overline{BL2}$ extends in the first layer to contact 40. Contact 40 connects $\overline{BL2}$ to the third layer (typically polysilicon) and $\overline{BL2}$ extends in the third layer in row 1 to angled line 33 to transfer $\overline{BL2}$ to row 2. As shown in FIG. 3b, the first, second and third lines are insulated from each other by a suitable material such as SiO$_2$ in the region of the structure where the bit-lines are not interconnected by contacts.

The memory cells 18 and 18' are preferably formed from vertical trench transistor and capacitor memory cell structures such as that described in U.S. Pat. No. 4,816,884 assigned to the same assignee as the present invention. However, the memory cells may be formed using conventional planar access transistor and trench capacitor structures as well. FIG. 3b illustrates the use of a vertical trench transistor structure having a U-groove shallow trench access transistor 50 stacked on top of a U-groove deep substrate plate trench storage capacitor 52. The cells are fabricated by using a self-alignment epitaxial growth method in combination with state of the art CMOS technologies. The entire disclosure of U.S. Pat. No. 4,816,884 is incorporated herein by reference.

FIG. 3c of the present invention is a cross-sectional view of the memory cell section 12 taken along line CC of FIG. 3a and depicts a vertical trench transistor 50 and a trench capacitor 52. The structure includes a silicon substrate 54 which for the purposes of explanation is p+ type. A p channel transfer device with gate 56, source 58 and drain 60 is made in an n-well region 62 within a p-type epitaxial layer 64. A trench capacitor is located in substrate 54 and filled with heavily doped p+ polysilicon 56. A composite film 68 of $SiO_2/Si_3/SiO_2$ on the trench sidewall is provided for the capacitor storage insulator. A p+ doped vertical connection 70 is formed to connect the source region of the transfer device and the storage electrode 66 of the trench capacitor. The diffusion layer 60 is the bit-line contact region connected to the drain of the transfer device and forms the contact to connect to the first metal layer. A layer 72 of insulating material such as $SiO_2$ is deposited above layer 62 and a word line 74 of polysilicon is formed. Another layer 76 of insulating material is deposited on the word line and the regions of conductive material are deposited to form the bit-lines 78 that extend in the first layer of metallization. A further insulating layer 79 is deposited on layer 76 and the regions of conductive material are deposited to form the bit-lines 80 that extend in the second layer of metallization. The n-well 62 extends across the entire memory cell area forming section 24, section 22 and section 26 so that all of the memory cells are formed in a single n-well.

In forming the memory device structure of the present invention, step 1 includes forming the trench capacitor. In step 2 the diffusion regions are formed. In step 3, the transistor trenches are formed and are filled with polysilicon to form the transfer gate of the transistor and the word lines. In addition, the polysilicon interconnect lines in means 22 are also formed. A layer of insulating material is deposited on the polysilicon and the first metal layer is deposited to form the bit-lines in the first level. Contact holes between the polysilicon and the first metal layer are opened in means 22 and sections 24 and 26 and appropriate material such as tungsten is used to fill the holes to connect the polysilicon to the first metal layer. A further insulating layer is deposited and the upper metal bit-lines are deposited.

The third level of interconnection in the transposing means provides an optimum and compact design that can be replicated with no spacial penalties throughout the rest of the cell matrix. Because of the replicable nature of the design and inherent layout characteristics, this architecture can readily adapt to any scaling of dimensions for upcoming technological advances. Even with the optimization of contact size and reduction of interconnection pitch and spacing, the configuration of the design is minimally altered. Contact and border overlap ground rules are the basic constraints to the overall size of inter-traversing area. Although not required, borderless contacts would highly enhance and expedite the already dense packing characteristics of this design. The stacked bit-line architecture of the present invention can most readily conform to the demands for both high density packaging and high noise immunity for the upcoming generation of very sophisticated memory chips.

While the invention has been particularly shown and described with respect to the preferred embodiments thereof, it should be understood by those skilled in the art that the foregoing and other changes in form and details may be made therein without departing from the spirit and scope of the invention which should be limited only by the scope of the appended claims.

Having thus described this invention, what is claimed as new, and is desired to be secured by Letters Patent is:

1. A semiconductor memory device comprising:
   an array of cross-point memory cells formed in a semiconductor substrate and arranged in rows and columns to form a matrix;
   a plurality of word lines connected to said memory cells in the columns of said matrix;
   a plurality of bit-lines connected to said memory cells in the rows of said matrix;
   said plurality of bit-lines comprising a plurality of bit-line pairs of true and complement bit-lines, the true and complement bit-lines of each bit-line pair being vertically stacked one above the other in first and second interconnection layers, respectively, one of the true and complement bit-lines of each bit-line pair being connected to a memory cell in each column of said matrix;
   means for transposing the vertical stacking of the true and complement bit-lines of each bit-line pair to be within the second and first interconnection layers, respectively; and
   a plurality of sense amplifiers, the true and complement bit-lines of each bit-line pair being connected to a corresponding one of said plurality of sense amplifiers.

2. The semiconductor memory device of claim 1 wherein said plurality of bit-line pairs include at least one sub-array of first and second bit-line pairs, the first and second bit-line pairs of each sub-array being planarly aligned parallel to each other in corresponding first and second rows, respectively, said transposing means including means for transposing the planar alignment of the first and second bit-line pairs to be within the second and first rows, respectively.

3. The semiconductor memory device of claim 2 further including n transposing means, where n is an odd integer.

4. The semiconductor memory device of claim 3 wherein said plurality of sense amplifiers are arranged on opposite outer borders of said substrate.

5. The semiconductor memory device of claim 1 wherein said transposing means comprises first, second and third interconnection layers.

6. The semiconductor memory device of claim 5 wherein said transposing means includes means for interconnecting the first layer to the third layer and for interconnecting the second layer to the first layer, the first layer formed above the third layer and the second layer formed above the first layer.

7. The semiconductor memory device of claim 6 wherein the third interconnection layer is comprised of polycrystalline silicon.

8. The semiconductor memory device of claim 7 wherein the first and second interconnection layers are comprised of a metal selected from the group consisting of tungsten and aluminum.

9. The semiconductor memory device of claim 1 wherein each of said cross-point memory cells includes an access transistor and a storage capacitor thereby forming an integrated circuit DRAM.

10. The semiconductor memory device of claim 9 wherein said storage capacitor is a trench capacitor and said access transistor is a trench transistor vertically aligned over said storage capacitor.

11. The semiconductor memory device of claim 3 wherein each of said cross-point memory cells includes an access transistor and a storage capacitor thereby forming an integrated circuit DRAM.

12. The semiconductor memory device of claim 11 wherein said storage capacitor is a trench capacitor and said access transistor is a trench transistor vertically aligned over said storage capacitor.

13. The semiconductor memory device of claim 6 wherein each of said cross-point memory cells includes an access transistor and a storage capacitor thereby forming an integrated circuit DRAM.

14. The semiconductor memory device of claim 13 wherein said storage capacitor is a trench capacitor and said access transistor is a trench transistor vertically aligned over said storage capacitor.

* * * * *

UNITED STATES PATENT AND TRADEMARK OFFICE
CERTIFICATE OF CORRECTION

PATENT NO. : 5,107,459
DATED : April 21, 1992
INVENTOR(S) : Christopher M. Chu, et al.

It is certified that error appears in the above-identified patent and that said Letters Patent is hereby corrected as shown below:

In the Abstract, line 5: delete "metal" and insert --interconnection--

Column 3, line 51: "add" should read as --and--
Column 3, line 57: "BL8" should read as --$\overline{BL8}$--
Column 4, line 14: after "bit-line" insert --$\overline{BL1}$--
Column 4, line 17: after "bit-line" insert --$\overline{BL2}$--
Column 4, line 19: "$\overline{BL2}$" should read as --BL2--
Column 4, line 20: "BL2" should read as --$\overline{BL2}$--
Column 4, line 31: "bit-line $\overline{BL1}$ extends" should read as --bit-line BL1 and $\overline{BL1}$ extends--
Column 6, line 5: "BL2" should read as --$\overline{BL2}$--

Signed and Sealed this

Seventh Day of September, 1993

Attest:

BRUCE LEHMAN

Attesting Officer

Commissioner of Patents and Trademarks